(12) United States Patent
Mayer

(10) Patent No.: US 7,865,995 B2
(45) Date of Patent: Jan. 11, 2011

(54) METHODS AND APPARATUS FOR REDUCING BUILDUP OF DEPOSITS IN SEMICONDUCTOR PROCESSING EQUIPMENT

(75) Inventor: Eugene J. Mayer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 1103 days.

(21) Appl. No.: 11/551,498

(22) Filed: Oct. 20, 2006

(65) Prior Publication Data
US 2007/0089253 A1    Apr. 26, 2007

Related U.S. Application Data

(60) Provisional application No. 60/730,537, filed on Oct. 26, 2005.

(51) Int. Cl.
*B08B 9/47* (2006.01)
(52) U.S. Cl. .................. 15/104.09; 15/104.095
(58) Field of Classification Search ............ 15/104.05, 15/104.09, 104.095, 104.16, 104.17, 246.5; B08B 9/45, B08B 9/47, 9/55
See application file for complete search history.

(56) References Cited

U.S. PATENT DOCUMENTS

| 2,803,842 | A | * | 8/1957 | Fuller | 15/104.095 |
| 3,824,646 | A | * | 7/1974 | Jai | 15/104.095 |
| 3,901,132 | A | | 8/1975 | Jai | |
| 4,137,928 | A | * | 2/1979 | Sentell | 134/167 C |
| 5,765,510 | A | * | 6/1998 | Krowech et al. | 122/379 |

FOREIGN PATENT DOCUMENTS

| DE | 10 2004 060 289 | 4/2006 |
| GB | 2342372 | 4/2000 |
| WO | WO 95/04207 | 2/1995 |

OTHER PUBLICATIONS

Search Report for GB0621327.6; Issued Jan. 22, 2007.

* cited by examiner

*Primary Examiner*—Monica S Carter
*Assistant Examiner*—Stephanie Newton
(74) *Attorney, Agent, or Firm*—Myers Bigel Sibley & Sajovec

(57) ABSTRACT

An apparatus for cleaning a gas tube includes an actuator and a plunger head attached to the actuator. The actuator is configured to reciprocate the plunger head along a longitudinal axis of the gas tube between a retracted position and an extended position and to rotate the plunger head from a first angular position to a second angular position. A method of cleaning a gas tube includes positioning a plunger head including a plurality of longitudinally extending tines in the gas tube, rotating the plunger head relative to a longitudinal axis of the gas tube, and scraping deposits from an interior surface of the gas tube using longitudinally extending edges of the tines.

12 Claims, 5 Drawing Sheets

METHODS AND APPARATUS FOR REDUCING BUILDUP OF DEPOSITS IN SEMICONDUCTOR PROCESSING EQUIPMENT

RELATED APPLICATION

This application claims the benefit of and priority to U.S. Provisional patent application No. 60/730,537, filed Oct. 26, 2005, the disclosure of which is hereby incorporated herein by reference as if set forth in its entirety.

FIELD OF THE INVENTION

The present invention relates to semiconductor processing equipment, and, in particular, to methods and apparatus for processing waste components generated in semiconductor processes.

BACKGROUND

Many semiconductor processes employ process gases containing reactant materials that are used to form and/or treat semiconductor materials. For example, chemical vapor deposition (CVD) processes typically employ process gases to provide source materials for the growth and/or formation of thin layers of materials. Metal-organic CVD processes may use metal-organic process gases such as trimethyl gallium (TMG) and trimethyl aluminum (TMA) as source gases for gallium and aluminum, respectively. Halides, such as $BCl_3$, and other materials, such as silane ($SiH_4$), may be used in CVD processes. Fluorine-based gases, such as $NF_3$ and $SF_6$, may also be used in semiconductor processing operations.

In a CVD process, reactant gases are generally flowed across a growth substrate in a reaction chamber at a high temperature. The reactant gases may decompose near the growth substrate and deposit on the substrate to form a layer of material on the substrate. The CVD reaction may generate a number of waste byproducts (components), such as unreacted components of reactant gases, carrier gases, reaction byproducts, and/or other waste components. These waste components are typically flushed from the reaction chamber through an exhaust tube and/or vent during and/or after the semiconductor processing.

Many gases used in semiconductor processes, and the gaseous byproducts of the semiconductor processes, may pose health and/or environmental hazards. Thus, exhaust gases generated by semiconductor processes are typically treated to reduce such potential hazards. Exhaust gases may be treated, for example, using a thermal processing unit (TPU) that may thermally decompose exhaust gases. A TPU, which may be electrically-fired and/or fuel-fired, may be configured to combust exhaust gases and scrub the combusted gases to reduce hazardous air pollutants.

Conventionally, a TPU is coupled to a semiconductor processing tool by means of a TPU inlet tube, which receives exhaust gases generated in the tool. Waste byproducts in the exhaust gases may build up as deposits in the inlet tube, which may cause the inlet tube to become partially and/or completely blocked. It may be difficult and/or time-consuming to clean and/or replace an inlet tube of a TPU. Moreover, to clean and/or replace an inlet tube of a TPU, it may be necessary to inactivate the semiconductor processing equipment that uses the TPU, which may result in significant expense and/or loss of equipment utilization.

In conventional systems, it is known to use a pneumatic piston to scrape built-up waste deposits from the inside of a TPU inlet tube. Although such conventional approaches may reduce build-up of waste materials in a TPU inlet tube, such approaches have not been entirely successful, with the result that it may frequently be necessary to manually clean a TPU inlet tube, even when such approaches are employed.

SUMMARY

Some embodiments of the invention provide an apparatus for cleaning a gas tube having a longitudinal axis. The apparatus includes an actuator and a plunger head attached to the actuator. The actuator is configured to reciprocate the plunger head along the longitudinal axis between a retracted position and an extended position and to rotate the plunger head from a first angular position to a second angular position. At least a portion of the plunger head is located within the gas tube when the plunger arm is in the extended position. In addition, at least a portion of the plunger head may be located within the outlet tube when the plunger arm is in the retracted position.

The actuator may be further configured to rotate the plunger head from the first angular position when the plunger head is in the retracted position to the second angular position when the plunger head is in the extended position as the plunger head is moved from the retracted position to the extended position.

In some embodiments, the actuator may be further configured to rotate the plunger head from a first angular position to the second angular position while the plunger head is in the extended position.

The apparatus may further include a gas coupling chamber coupled to the gas tube. A housing may be disposed on the gas coupling chamber opposite the gas tube, and the actuator may be mounted in the housing. The gas coupling chamber may include a gas inlet spaced apart from the actuator housing and the gas tube.

The plunger head may include a support member and a plurality of tines extending from the support member. Respective ones of the plurality of tines include a first portion extending radially away from a longitudinal axis extending through the support member and longitudinally away from a coupling location on the axial member and a second portion extending away from the first portion parallel to the longitudinal axis.

The coupling location may include a mounting nut on the support member, and the first portions of the plurality of tines may extend from the mounting nut.

The plurality of tines may be spaced evenly around the support member relative to the longitudinal axis by an angular spacing between adjacent tines, and the angular spacing between adjacent tines may be no more than the angular spacing between the first angular position and the second angular position.

The second portions of the tines may be disposed at a radial distance from the longitudinal axis that is no greater than a radius of the gas outlet tube.

In some embodiments, the second portions of the tines may be disposed at a radial distance from the longitudinal axis that is greater than the radius of the gas outlet tube, such that the second portions of the tines are biased against an interior of the gas outlet tube by the first portions of the tines. The first portions of the tines may extend longitudinally at an angle relative to the axial member that is selected to provide substantially uniform scraping force to the gas tube when biased by the first portions during rotation from the first angular position to the second angular position.

The actuator may include a plunger arm attached to the plunger head, the plunger arm having helical features thereon that are configured to cause the plunger head to rotate between the first angular position in the retracted position and the second angular position in the extended position.

The actuator may include a pneumatic cylinder having a cylindrical sleeve and a plunger arm attached to the plunger head and disposed within the cylindrical sleeve. The cylindrical sleeve may include helical features that are configured to cause the plunger arm to rotate between the first angular position in the retracted position and the second angular position in the extended position.

Some embodiments of the invention provide a plunger head for cleaning semiconductor processing equipment. The plunger head may include a support member and a plurality of tines extending from a coupling location on the axial member. Respective ones of the plurality of tines may include a first portion extending radially away from a longitudinal axis extending through the support member and longitudinally away from a coupling location on the axial member and a second portion extending away from the first portion parallel to the longitudinal axis.

The plunger head may further include a mounting nut on the axial member, and the first portions of the plurality of tines may extend from the mounting nut. The plurality of tines may be spaced evenly around the support member relative to the longitudinal axis. In particular embodiments, the plurality of tines may include three tines that are spaced evenly around the axial member relative to the longitudinal axis.

Some embodiments of the invention provide methods of cleaning a gas tube of a semiconductor processing equipment. The methods include positioning a plunger head including a plurality of longitudinally extending tines in the gas tube, rotating the plunger head about a longitudinal axis of the gas tube, and scraping deposits from the gas tube using longitudinally extending edges of the plurality of longitudinally extending tines. The methods may further include biasing the longitudinally extending tines against the interior surface of the gas tube.

The methods may further include reciprocating the plunger head into/out of the gas tube between a retracted position and an extended position while rotating the plunger head.

In some embodiments, the plurality of longitudinally extending tines may be spaced apart from one another by an angular spacing, and rotating the plunger head may include rotating the plunger head by an angular distance that is greater than or about equal to the angular spacing as the plunger head is reciprocated between the extended position and the retracted position.

In further embodiments, the plurality of longitudinally extending tines may be spaced apart from one another by an angular spacing, and rotating the plunger head may include rotating the plunger head by an angular distance that is less than the angular spacing as the plunger head is reciprocated between the extended position and the retracted position.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
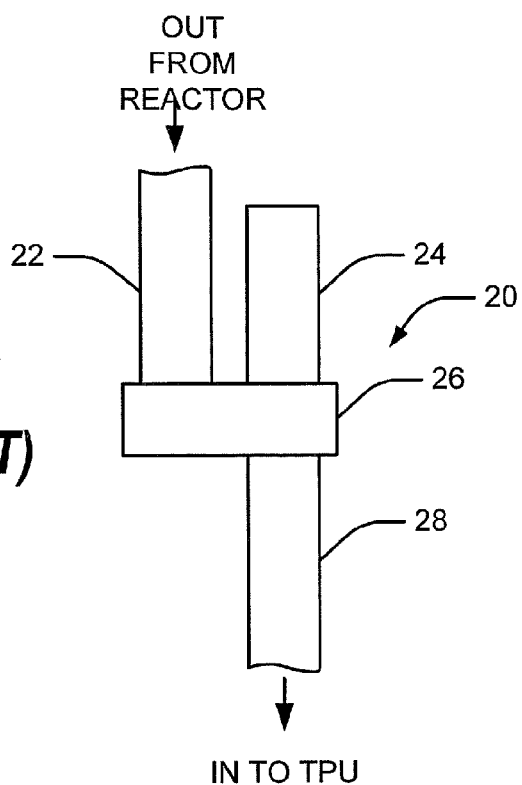
FIG. 1 is a schematic diagram illustrating a conventional exhaust coupling apparatus.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising,"

"includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Typically, an inlet tube of a TPU is coupled to an exhaust tube of a semiconductor processing tool, such as a CVD reactor. A conventional exhaust coupling apparatus 20 is illustrated in FIG. 1. As shown therein, waste components that are output from a reaction chamber (not shown) of the semiconductor processing tool flow through an exhaust tube 22 of the semiconductor processing tool into an exhaust coupling chamber 26. The waste components flow from the exhaust coupling chamber 26 into an inlet tube 28 of a TPU (not shown). In order to reduce build-up of waste material in the TPU inlet tube 28, a plunger housing 24 may be affixed to and/or formed integrally with the exhaust coupling chamber 26 opposite the TPU inlet tube 28 as shown.

Figure 2:
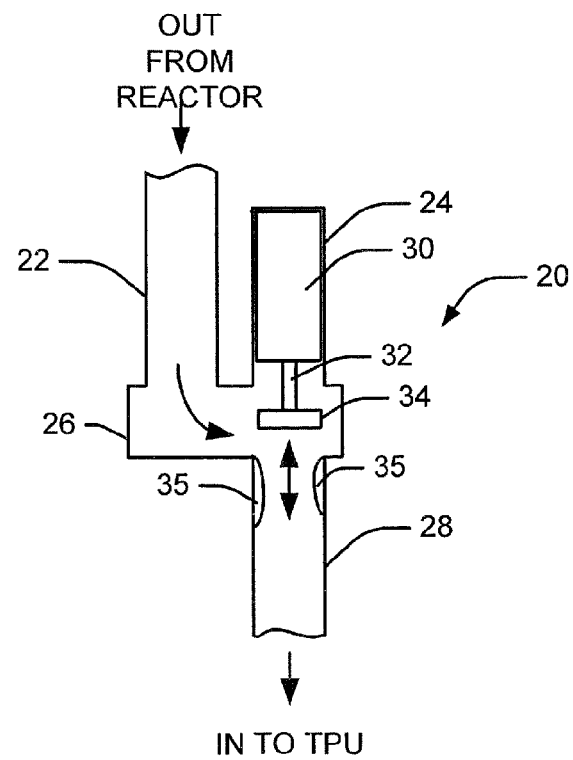
FIG. 2 is a cutaway schematic diagram illustrating a conventional exhaust coupling apparatus.

The exhaust coupling apparatus 20 includes a conventional cleaning apparatus and is illustrated in FIG. 2. As shown therein, waste materials 35 may build up within the TPU inlet tube 28 at or near an interface of the TPU inlet tube 28 with the exhaust coupling chamber 26. If left unchecked, such waste materials 35 may clog the TPU inlet tube 28, and may eventually choke off the tube 28 altogether.

In order to reduce build-up of waste materials 35 within the TPU inlet tube 28, an actuator, such as a pneumatic and/or hydraulic cylinder 30, may be disposed within the plunger housing 24. A plunger arm 32 extends longitudinally from the pneumatic cylinder 30 towards the TPU inlet tube 28.

A plunger head 34 is affixed to an end of the plunger arm 32 that extends away from the pneumatic cylinder 30. A conventional plunger head 34 may include a metal spring, for example. The plunger arm 32 and plunger head 34 may reciprocated by the pneumatic cylinder 30 into and out of the TPU inlet tube 28 in a longitudinal direction (i.e. in a direction parallel to the TPU inlet tube 28). As the plunger head 34 is cycled longitudinally in and out of the TPU inlet tube 28, the plunger head 34 may contact and may scrape waste materials 35 that are built-up on an inside surface of the TPU inlet tube 28, which may cause the waste materials 35 to fall into the TPU inlet tube 28 so that they may be processed by the TPU. However, the longitudinal scraping action of a conventional apparatus may be insufficient to efficiently remove build up of certain types of deposits.

Figure 3:
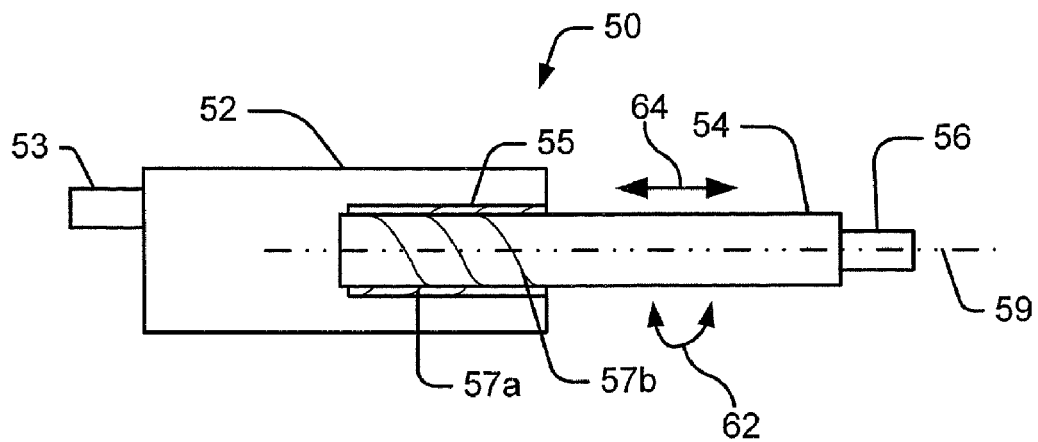
FIG. 3 is a schematic diagram illustrating a pneumatic cylinder and plunger according to some embodiments of the invention.
Figure 4:
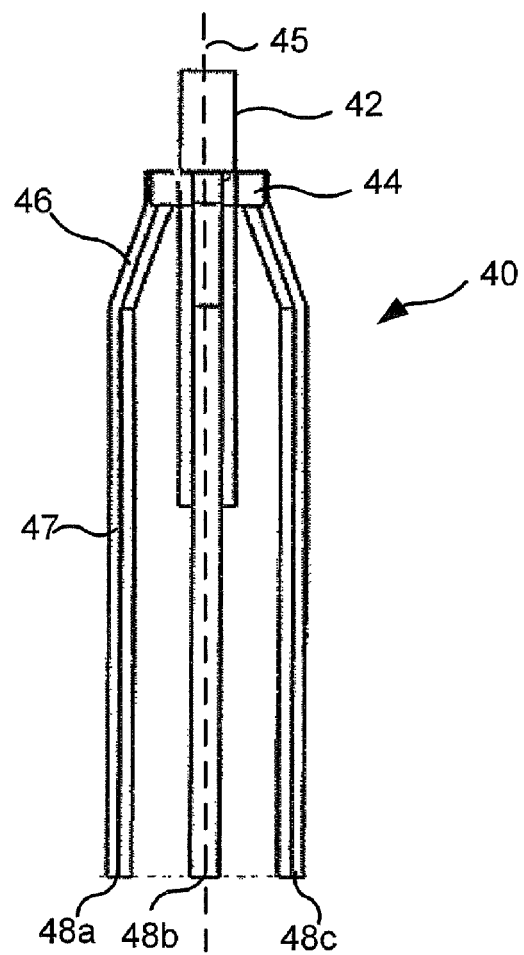
FIG. 4 is a schematic front view illustrating a plunger head according to some embodiments of the invention.
Figure 5:
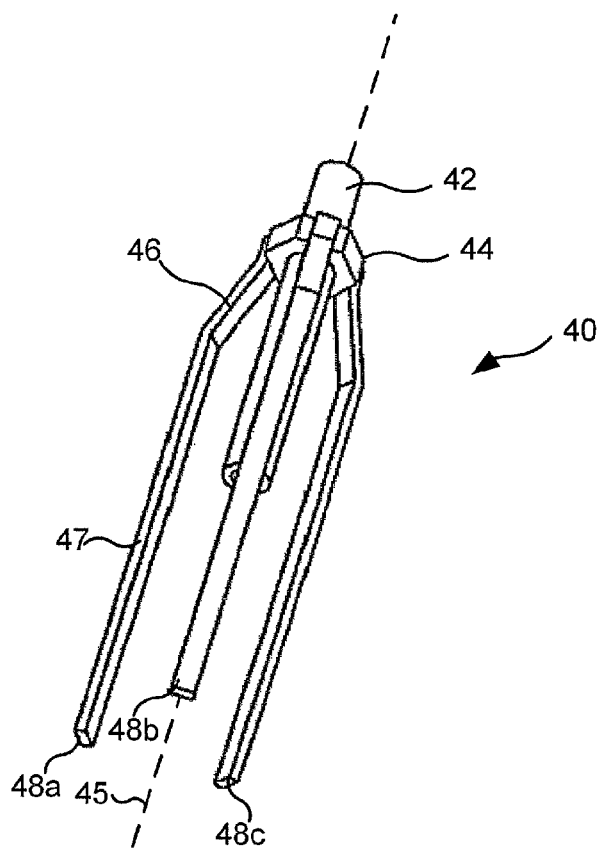
FIG. 5 is a perspective view illustrating a plunger head according to some embodiments of the invention.

A plunger assembly 50 according to some embodiments of the invention is illustrated in FIG. 3. The plunger assembly 50 includes an actuator 52, which may be a pneumatic and/or hydraulic cylinder having a fluid inlet/outlet 53 therein for receiving/expelling gas/fluid that may be used to pneumatically or hydraulically drive a plunger arm 54. It will be appreciated that the actuator 52 may be implemented using any mechanism configured to reciprocate the plunger arm 54. Although in the illustrated embodiments the plunger arm 54 may be driven by pneumatic action, it will be appreciated that the plunger arm 54 may be driven mechanically instead of pneumatically or hydraulically, for example by means of an electric motor, a magnetic drive or the like, or by other means known to those skilled in the art. Accordingly, embodiments of the invention are not limited to the use of pneumatic cylinders as the actuator. However, for purposes of description, the actuator 52 will be referred to below as a pneumatic cylinder 52.

An optional connector 56 configured to receive a plunger head may be disposed at a distal end of the plunger arm 54 located away from the pneumatic cylinder 52.

As the plunger arm 54 reciprocates into/out of the pneumatic cylinder 52, the plunger arm 54 may pass through a cylindrical sleeve 55. The cylindrical sleeve 55 may include therein one or more helical features, such as helical grooves and/or helical protrusions 57a, that may cooperate with respective grooves, threads and/or protrusions on an outer surface of the plunger arm 54 to cause the plunger arm 54 to rotate about a longitudinal axis 59 as it is driven into/out of the pneumatic cylinder 52. Alternatively or additionally, the plunger arm 54 may include one or more helical features, such as helical grooves and/or helical protrusions 57b, on an outer surface thereof that may cooperate with respective grooves, threads and/or protrusions on an inner surface of the cylindrical sleeve 55, to cause the plunger arm 54 to rotate in a circumferential direction 62 about the longitudinal axis 59 as it is driven into/out of the pneumatic cylinder 52 in a longitudinal direction 64. A plunger head may be detachably affixed to the optional connector 56 and/or directly to the distal end of the plunger arm 54.

Instead of using helical grooves/protrusions, the plunger arm 54 may be rotated about the longitudinal axis 59 by other means known to those skilled in the art, such as an electric motor, a magnetic drive and/or the like, as it is reciprocated into/out of the pneumatic cylinder 52.

FIGS. 4-7 are schematic views illustrating a plunger head 40 according to some embodiments of the invention. As shown in FIGS. 4-7, the plunger head 40 may include an axial member 42 extending along a central axis 45 thereof. In the illustrated embodiments, the axial member 42 includes a metal tube. A mounting nut 44 may be affixed to the axial member 42, and a plurality of tines 48a-48c may be affixed to the mounting nut 44. In some embodiments, the tines 48a-48c may be welded to the mounting nut 44. However, the tines 48a-48c may be affixed to the mounting nut 44 by any means known to those skilled in the art, such as, for example, using mechanical fasteners, adhesives, of the like. The tines 48a-48c may extend away from the mounting nut 44.

It will be appreciated that the mounting nut 44 and the axial member 42 may be provided as separate components and/or may be formed as an integral component. It will be further appreciated that the mounting nut 44 may be omitted altogether, in which case the tines 48a-48c may be affixed directly to the axial member 42.

Figure 7:
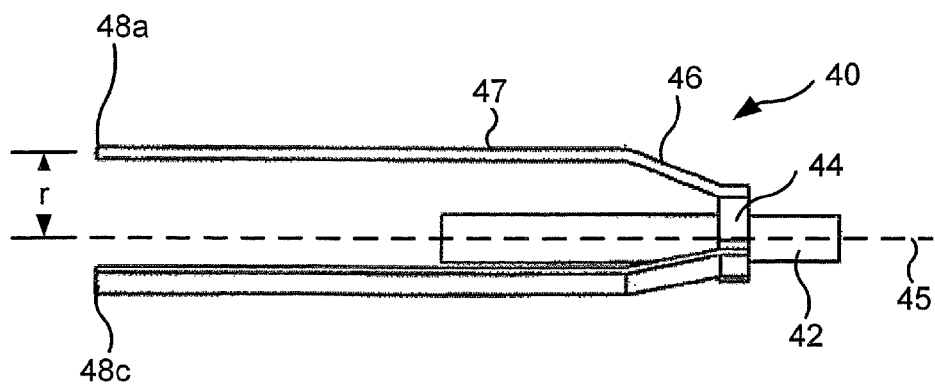
FIG. 7 is a schematic side view illustrating a plunger head according to some embodiments of the invention.

Each of the tines 48a-48c may include a first portion 46 that extends radially and longitudinally away from the mounting nut 44, such that it is angled away from the central axis 45, and a second portion 47 that runs generally parallel to the central axis 45 away from the first portion 46. The first portion 46 may extend at an angle and/or length such that the second portion 47 may be spaced away from the central axis 45 by a distance that is approximately equal to a radius of a tube, such as a TPU inlet tube, in which the plunger head 40 is used. As shown in FIG. 7, the outer surfaces of the second portions 47 of the tines 48a-48c may be spaced away from the central axis 45 by a distance r that is slightly less than, equal to, or slightly greater than a radius of a tube, such as a TPU inlet tube, in which the plunger head 40 is used. It will be appreciated that the tines 48a-48c need not actually touch the inner surface of the tube in order to reduce the build-up of deposits by an amount sufficient to permit the flow of gas through the tube. For example, in some cases, it may be sufficient for the head 40 to punch through material that has built up within the tube without necessarily scraping off all of the material that has built up on the walls of the tube.

In addition to providing the second portions 47 at a desired spaced radial position, the first portions 46 may function as springs to bias the second portions 47 against an interior surface of a tube, such as a TPU inlet tube, in which the plunger head 40 is used, particularly when the distance r is slightly greater than the radius of the receiving tube. The tines 48a-48c may be formed, for example, of stainless steel.

As noted above, the second portions 47 of the tines 48a-48c extend in a longitudinal direction substantially parallel to a central axis 45 of the plunger head 40. Thus, when the plunger head 40 is inserted into a tube, such as a TPU inlet tube, and the plunger head is rotated about the central axis 45, the tines 48a-48c may scrape against the interior of the tube and/or deposits built up thereon in a circumferential direction, that is, in a direction that is perpendicular and/or oblique to the longitudinal direction of the tube.

Figure 6:
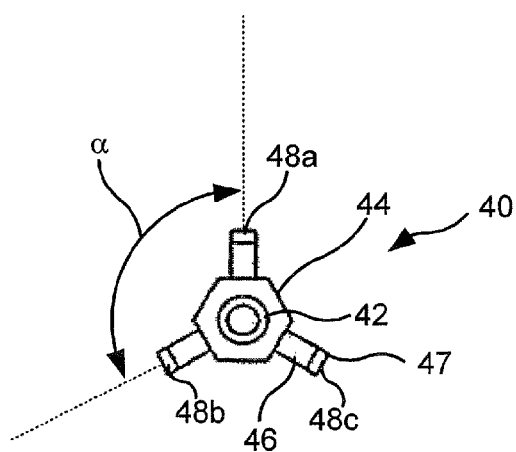
FIG. 6 is a schematic top view illustrating a plunger head according to some embodiments of the invention.

In the illustrated embodiments, the plunger head 40 includes three tines 48a-48c spaced evenly about a central axis 45 of the plunger head 40 at an angular spacing α of about 120°, as seen most clearly in FIG. 6. However, the plunger head 40 may include more or fewer tines than the three tines illustrated. Moreover, the tines may be evenly and/or unevenly spaced around the plunger head 40.

As the plunger head 40 is reciprocated both longitudinally and circumferentially about the central axis 45, the tines 48a-c of the plunger head 40 may follow a generally helical path. Thus, the punching/scraping action may proceed in a helical or spiraling path relative to the central axis 45. This may be contrasted to conventional approaches in which the scraping action is typically performed in a longitudinal direction that is parallel to both the tube being cleaned as well as to the direction of flow of exhaust gases in the tube.

Figure 8:
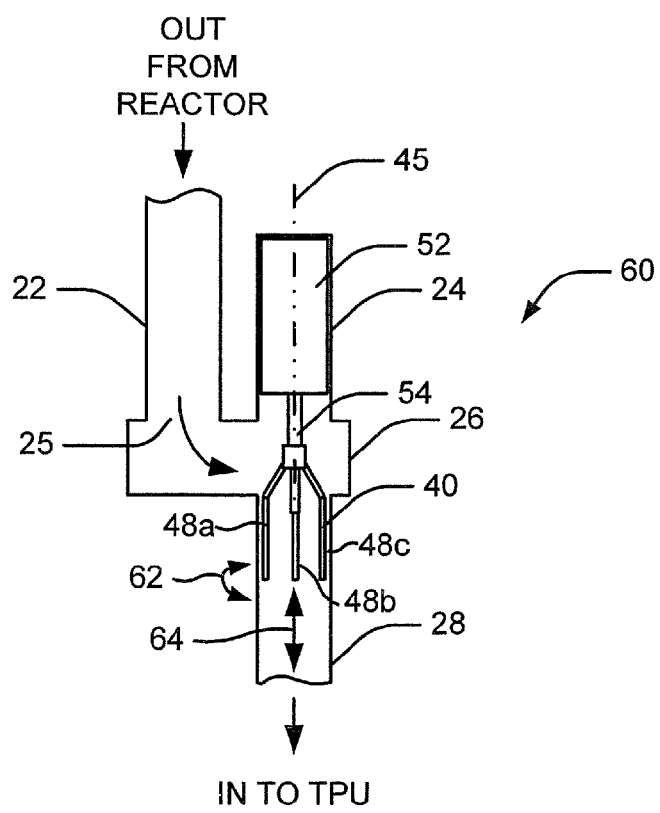
FIG. 8 is a cutaway schematic diagram illustrating an exhaust coupling apparatus according to some embodiments of the invention.

FIG. 8 is a cutaway diagram illustrating a cleaning apparatus 60 according to some embodiments of the invention. As shown therein, waste components output from a reaction chamber flow through an inlet 25 coupled to an exhaust tube 22 of the semiconductor processing equipment into an exhaust coupling chamber 26. The waste components flow from the exhaust coupling chamber 26 into an inlet tube 28 of a TPU (not shown). A plunger housing 24 is be affixed to and/or is formed integrally with the exhaust coupling chamber 26 opposite the TPU inlet tube 28 as shown.

A pneumatic cylinder 52 (or the like as discussed above) may be disposed within the plunger housing 24. A plunger arm 54 extends longitudinally from the pneumatic cylinder 52 towards the TPU inlet tube 28. A plunger head 40 is affixed to an end of the plunger arm 54 that extends away from the pneumatic cylinder 52. The plunger arm 54 and plunger head 40 are driven by the pneumatic cylinder 52 into and out of the TPU inlet tube 28 in a longitudinal direction (i.e. in a direction parallel to the TPU inlet tube 28). As the plunger arm 54 and plunger head 40 are driven in a longitudinal direction 64 into/out of the TPU inlet tube 28, the plunger arm 54 and plunger head 40 may be rotated about a central axis 45 in a circumferential direction 62 as described above.

As the plunger head 40 is cycled longitudinally in and out of the TPU inlet tube 28 and rotated about a central axis 45 thereof, the tines 48a-c of the plunger head 40 may scrape waste materials that may build up on an inside surface of the TPU inlet tube 28 in a scraping motion that proceeds circumferentially around an interior surface of the inlet tube 28 as the tines 48a-c of the plunger head 40 travel in a helical path relative to the central axis 45. The scraping action of the tines 48a-c may be performed primarily by the outer surfaces and/or ridges of the second portions 47 of the tines 48a-c, which extend in a longitudinal direction substantially parallel with the central axis 45. The punching/scraping action of the plunger head 40 may cause built up waste materials to fall into the TPU inlet tube 28 so that they may be processed by the TPU.

Figure 9A:
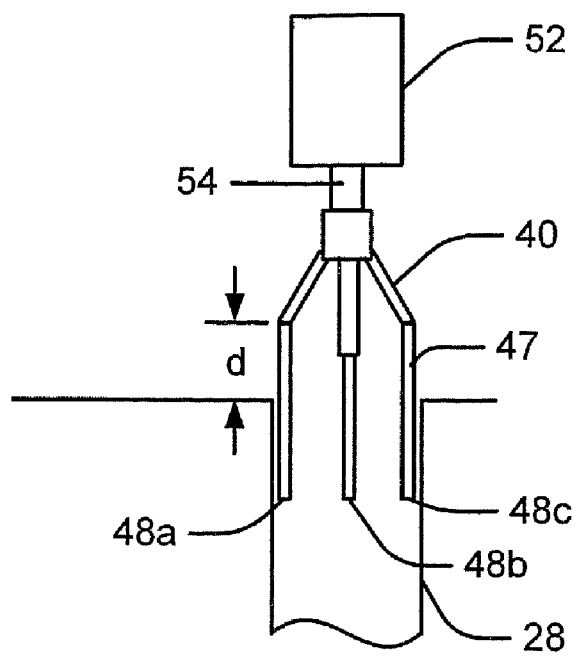
FIGS. 9A-9B are schematic diagrams illustrating the operation of a cleaning apparatus according to some embodiments of the invention.
Figure 9B:
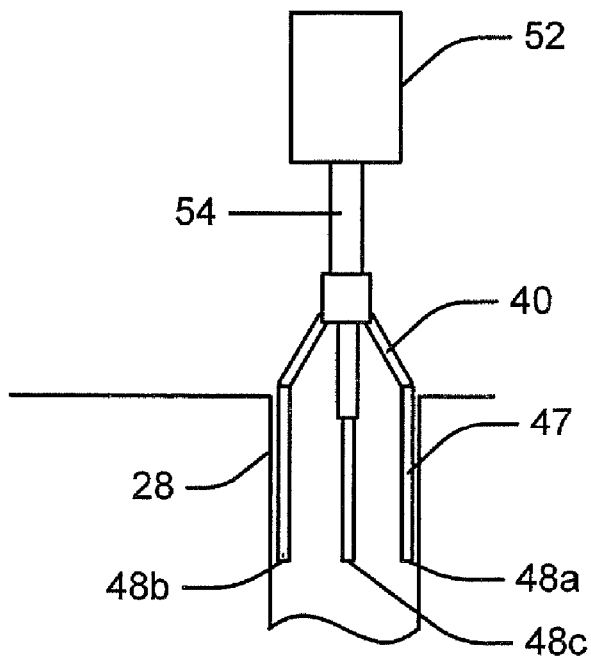

FIGS. 9A-9B are schematic diagrams illustrating the operation of a plunger assembly including a plunger arm and a plunger head according to some embodiments of the invention. As illustrated in FIG. 9A, a plunger head 40, which is disposed at the end of a plunger arm 54 that extends from a pneumatic cylinder 52, is inserted into a tube, such as a TPU inlet tube 28. With the plunger arm 54 fully and/or partially retracted into the pneumatic cylinder 52, the plunger head 40 may be positioned, in a retracted position, partially within the tube 28 such that at least a length d of the second portions 47 of the tines 48a-48c remains outside the tube 28.

As illustrated in FIG. 9B, as the plunger arm 54 is extended from the pneumatic cylinder 52 by a distance d, the plunger head 40 is driven into the tube 28 by the same distance to an extended position and is concurrently rotated about a central axis thereof. In particular, the plunger head 40 may be rotated such that, when the plunger arm 54 has been extended by at least a distance d, the plunger head has been rotated by at least an angle sufficient to move a tine 48b to an angular position previously occupied by an adjacent tine, such as tine 48a. Accordingly, the amount of angular rotation that may be performed for a given insertion length may depend on the angular spacing α of adjacent tines 48 to help provide that a desired circumference of the tube 28 is scraped in each cycle of the plunger arm 54 into/out of the cylinder 52.

In some embodiments, in order to help provide complete scraping coverage, the plunger head 40 may be rotated by an angle that is greater than the angular spacing of adjacent tines 48 in each cycle of the plunger arm 54 into/out of the cylinder 52. However, in some embodiments, the plunger head 40 may be rotated by an angle that is less than the angular spacing of adjacent tines 48, while still achieving a reduction of waste deposits on the interior surface of the tube 28. For example, for an angular spacing α of 120° between adjacent tines 48, it may be sufficient to rotate the plunger head 40 by an angle of only about 90° as the head travels between a retracted position and an extended position.

The head 40 need not include tines 48, but may include ridges, protrusions or other scraping features/elements thereon. Also, the plunger head 40 need not be reciprocated in and out of the tube but may be inserted into the tube and spun about the central axis. Thus, in some embodiments, the motion of the plunger head 40 may include only rotational motion and not longitudinal motion.

The rate of punching/scraping (e.g. in cycles per minute) may be determined by the type of actuator used. The punching/scraping procedure may be performed often enough to reduce build up of deposits such that the exhaust tube does not become significantly blocked. For example, it may be sufficient to cycle the head 40 one or more times every five minutes.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An apparatus for cleaning a gas tube having a longitudinal direction, the apparatus comprising:

an actuator; and a plunger head attached to the actuator, wherein the actuator is configured to reciprocate the plunger head along the longitudinal direction between a retracted position and an extended position and to rotate the plunger head from a first angular position to a second angular position;

wherein at least a portion of the plunger head is located within the gas tube when the plunger head is in the extended position; and wherein the plunger head comprises at least one tine including a portion that extends parallel to the longitudinal direction when the plunger head is positioned within the gas tube, wherein the plunger head comprises:

a support member; and a plurality of tines including the at least one tine extending from the support member, respective ones of the plurality of tines including a first portion extending radially away from a longitudinal axis extending through the support member and longitudinally away from a coupling location on the support member and a second portion extending away from the first portion parallel to the longitudinal axis.

2. The apparatus of claim 1, wherein the actuator is configured to rotate the plunger head from the first angular position when the plunger head is in the retracted position to the second angular position when the plunger head is in the extended position as the plunger head is moved from the retracted position to the extended position.

3. The apparatus of claim 1, wherein the actuator is configured to rotate the plunger head from a first angular position to the second angular position while the plunger head is in the extended position.

4. The apparatus of claim 1, wherein that at least a portion of the plunger head is located within the gas tube when the plunger head is in the retracted position.

5. The apparatus of claim 1, further comprising:

a gas coupling chamber coupled to the gas tube; and a housing on the gas coupling chamber opposite the gas tube;

wherein the actuator is mounted within the housing; and wherein the gas coupling chamber includes a gas inlet spaced apart from the actuator housing and the gas tube.

6. The apparatus of claim 1, wherein the coupling location comprises:

a mounting nut on the support member, wherein the first portions of the plurality of tines extend from the mounting nut.

7. The apparatus of claim 1, wherein the plurality of tines are spaced evenly around the support member relative to the longitudinal axis by an angular spacing between adjacent tines, and wherein the angular spacing between adjacent tines is no more than the angular spacing between the first angular position and the second angular position.

8. The apparatus of claim 1, wherein the second portions of the tines are disposed at a radial distance from the longitudinal axis that is no greater than a radius of the gas tube.

9. The apparatus of claim 1, wherein the second portions of the tines are disposed at a radial distance from the longitudinal axis that is greater than the radius of the gas tube, such that the second portions of the tines are biased against an interior of the gas tube by the first portions of the tines.

10. The apparatus of claim 9, wherein the first portions of the tines extend longitudinally at an angle relative to the axial member that is selected to provide substantially uniform scraping force to the gas tube when biased by the first portions during rotation from the first angular position to the second angular position.

11. The apparatus of claim 1, wherein the actuator further comprises a plunger arm and wherein the plunger head is attached to the plunger arm; and wherein the plunger arm includes helical features thereon that are configured to cause the plunger arm to rotate between the first angular position when the plunger head is in the retracted position and the second angular position when the plunger head is in the extended position.

12. The apparatus of claim 1, wherein the actuator comprises a pneumatic cylinder including a cylindrical sleeve and a plunger arm disposed within the cylindrical sleeve, wherein the plunger head is attached to the plunger arm, and wherein the cylindrical sleeve includes helical features that are configured to cause the plunger arm to rotate between the first angular position when the plunger head is in the retracted position and the second angular position when the plunger head is in the extended position.

* * * * *